United States Patent [19]

Shoji et al.

[11] 3,946,425
[45] Mar. 23, 1976

[54] MULTI-EMITTER TRANSISTOR HAVING HEAVILY DOPED N+ REGIONS SURROUNDING BASE REGION OF TRANSISTORS

[75] Inventors: Senji Shoji; Kenjiro Yasunari; Yasunobu Kosa, all of Kodaira, Japan

[73] Assignee: Hitachi, Ltd., Japan

[22] Filed: May 14, 1974

[21] Appl. No.: 469,745

Related U.S. Application Data

[62] Division of Ser. No. 332,520, Feb. 14, 1973, abandoned, which is a division of Ser. No. 16,018, March 3, 1970, abandoned.

[30] Foreign Application Priority Data

Mar. 12, 1969  Japan .............................. 44-18336

[52] U.S. Cl. ..................... 357/64; 357/36; 357/48; 357/63; 357/89
[51] Int. Cl.² ................. H01L 27/04; H01L 29/167
[58] Field of Search .............. 357/36, 48, 63, 64, 89

[56] References Cited
UNITED STATES PATENTS

| | | | |
|---|---|---|---|
| 3,312,882 | 4/1967 | Pollock .................................. | 357/36 |
| 3,430,110 | 2/1969 | Goshgarian ........................... | 357/48 |
| 3,486,950 | 12/1969 | Lesk ...................................... | 357/64 |
| 3,602,779 | 8/1971 | Chapron ............................... | 357/64 |
| 3,607,468 | 9/1971 | Chang et al. .......................... | 357/48 |
| 3,702,955 | 11/1972 | Kalb et al. ............................. | 357/36 |
| 3,899,793 | 8/1975 | Wakamiya et al. .................... | 357/64 |

*Primary Examiner*—William D. Larkins
*Attorney, Agent, or Firm*—Craig & Antonelli

[57] ABSTRACT

In a semiconductor integrated circuit device in which a plurality of regions each having a semiconductor element such as a PN junction diode and a transistor are isolated electrically from one another by PN junctions formed between the respective regions and a semiconductor isolation region, gold is introduced into the regions having the semiconductor elements and the isolation region while at least one diffused region heavily doped, for example, with phosphorus is formed in the isolation region adjacent to the region having the PN junction diode or the transistor thereby to prevent the breakdown voltage of the backwardly biased PN junction in the diode or the transistor from decreasing. Further by surrounding all the transistors, at least in one of which gold is diffused, formed in one integrated circuit with heavily doped N+-type regions an integrated circuit with transistors having a small variation in current amplification factor is obtained.

13 Claims, 18 Drawing Figures

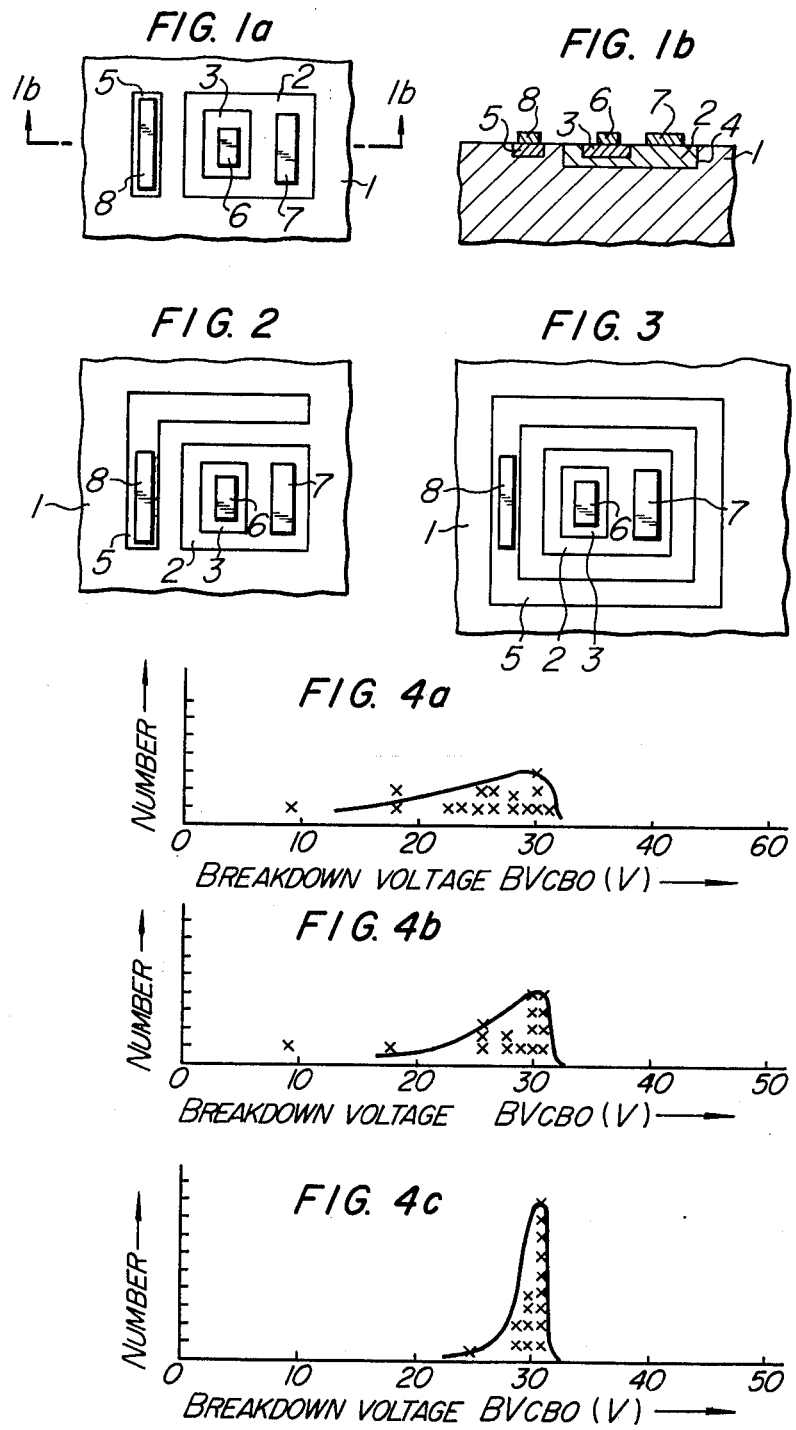

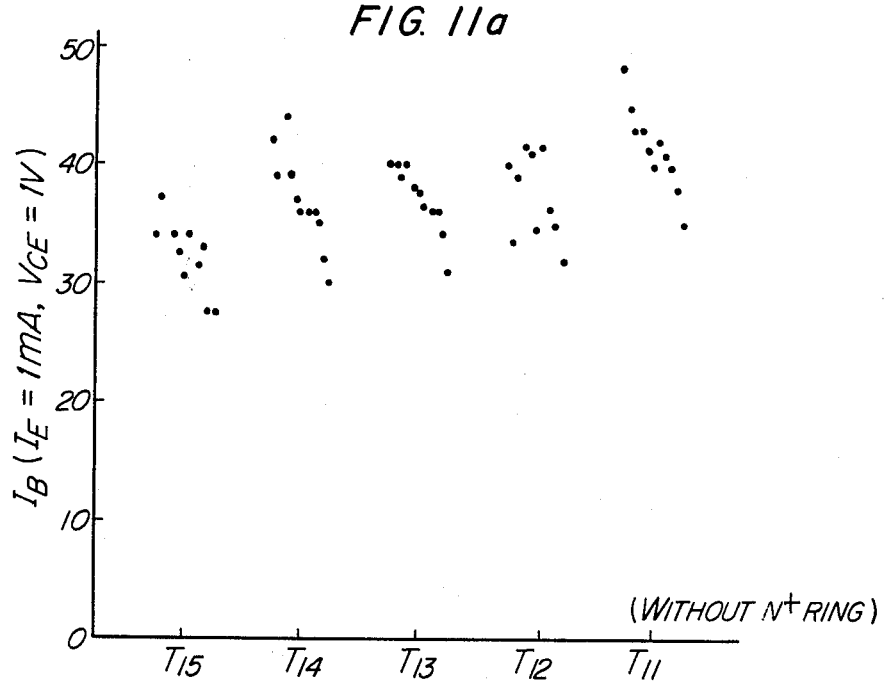
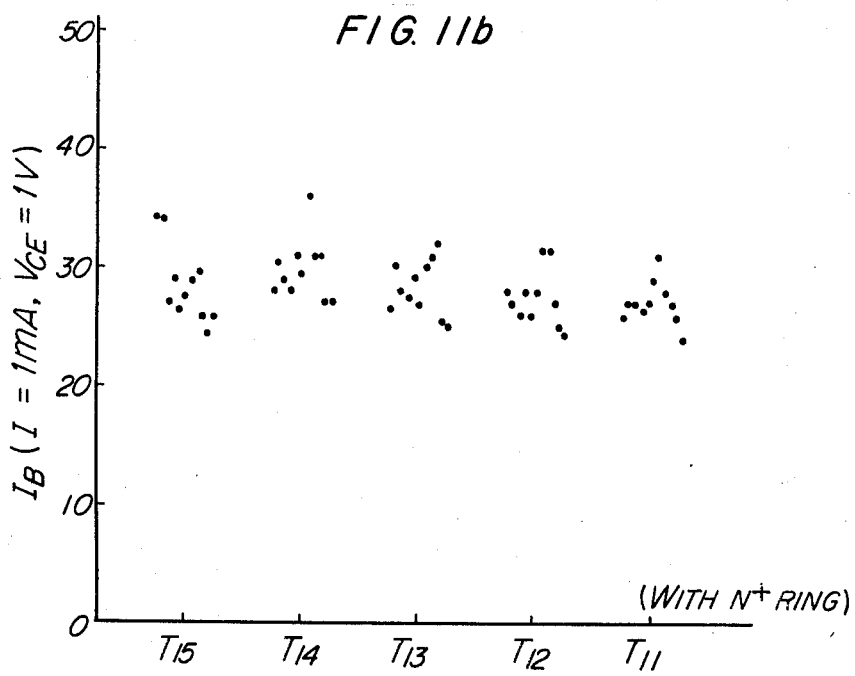

MULTI-EMITTER TRANSISTOR HAVING HEAVILY DOPED N+ REGIONS SURROUNDING BASE REGION OF TRANSISTORS

This application is a divison of application Ser. No. 332,520 filed Feb. 14, 1973, now abandoned, which is a division of application Ser. No. 16,018 filed Mar. 3, 1970 now abandoned.

This invention relates to a semiconductor component or an integrated circuit device wherein gold is introduced into the semiconductor body, and to a method of manufacturing the same.

In a semiconductor device such as a transistor and a diode utilizing a PN junction or junctions and minority carriers injected from the PN junction, a time delay in signal transmission is caused due to these minority carriers which are stored in the semiconductor regions adjacent to the PN junction, when, for example, the semiconductor device undergoes a switching operation. Further, the waveform of the signal is distorted or deteriorated. The effect due to the storage of minority carriers is called the storage effect, while the time delay of signal transmission is called the storage time.

In order to reduce the influence of such a storage effect a well known method is to introduce a so-called life time killer, an impurity capable of being a recombination center in a semiconductor crystalline body, for example, gold, platinum and iron, in order to decrease the life of minority carriers.

However, when such a life time killer is used, a remarkable increase in the reverse current near the breakdown voltage is seen in the voltage-current characteristic of the PN junction when the PN junction is reversely biased. The so-called soft breakdown phenomenon, results in such disadvantages as a decrease in the reverse breakdown voltage and an increase of their variation among the devices.

Furthermore, in a semiconductor crystal, for example, of silicon above about 900°C., gold has a much faster diffusion speed than the conductivity type determining impurities belonging to the III and V groups in the Periodic Table. Therefore, where the circuit element regions in the semiconductor integrated circuit device are electrically separated by the reversely biased PN junctions, it is extremely difficult to diffuse gold selectively into the semiconductor body excluding some circuit element regions. In order to realize this selective introduction of gold the distance between the circuit element regions should be sufficiently large. However, this is against the requirement of high quality and density of circuit elements.

The integrated circuit, where a plurality of transistors are formed in a sheet of semiconductor substrate, has a large variation of current amplification factor among the transistors with different structure. So, the degree of freedom or the allowance in design and use of the integrated circuit is restricted.

One object of this invention is to increase the breakdown voltage of PN junctions in the gold doped integrated circuit device wherein circuit elements are isolated by reversely biased PN junctions.

Another object of this invention is to provide an integrated circuit where the action of introduced the gold is localized without sacrificing the degree of integration.

Still another object of this invention is to provide a method for manufacturing an integrated circuit having a plurality of transistors capable of keeping their current amplification factors uniform or restricting them in a definite allowable range.

A further object of this invention is to provide an integrated circuit device capable of being manufactured at a high yield and with a high quality ratio.

According to this invention, the following phenomenon clarified by the inventors is effectively utilized. Namely, the life killing action of gold introduced in the semiconductor crystal is reduced by a region containing a high concentration of N-type impurity ($N^+$-type region). This fact leads to other favorable effects.

In one embodiment according to this invention, an $N^+$-type region, more preferably an $N^+$-type region doped with phosphorus as the impurity, is arranged in the neighborhood a semiconductor region where the action of gold is wanted to be killed. More specifically, this $N^+$-type region is made to contact with the region in which a semiconductor circuit element is formed. The formation of the $N^+$-type region or regions in a semiconductor isolation region electrically separating the semiconductor circuit elements from one other avoids the degradation of the degree of integration.

In another embodiment according to this invention, all transistors formed in one semiconductor substrate are surrounded with the $N^+$-type region or regions.

From our experiments later described it will be understood more clearly that a part of gold introduced into the semiconductor substrate is trapped by the $N^+$-type region and the distribution of gold in the substrate is controlled by adjusting the shape of the $N^+$-type region.

The above and other objects and features of this invention will be made more apparent from the preferred embodiments of this invention taken in conjunction with the accompanying drawings, in which;

FIGS. 1a, 2 and 3 are the plane views of transistors according to this invention;

FIG. 1b is a cross-sectional view taken along the line $I_b$—$I_b$ of FIG. 1a;

FIGS. 4a to 4c show the distribution of reverse breakdown voltage of the transistors shown in FIGS. 1a, 2 and 3, respectively;

FIGS. 11a and 11b show the distribution of base current of the transistors manufactured according to this invention. de First of all, the special phenomenon found by the inventors will be explained with reference to the transistors doped with gold. This phenomenon, the fundamental of this invention, appears when a high impurity concentration region is formed in a gold doped PN junction device.

Figure 5:
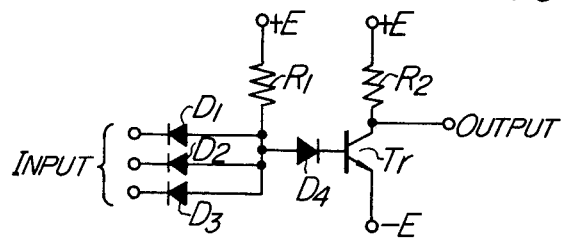
FIG. 5 is a connection diagram of a DTL (diode transistor logic) circuit.

FIGS. 1a, 1b, 2 and 3, where like reference numerals are used to denote like parts, show the plane views of gold doped transistors. For the sake of explanation the passivation films covering the surface of the semiconductor substrates are omitted. The numeral 1 denotes a collector region, 2 a base region formed in the collector region 1, and 3 an emitter region formed in the base region 2. The members 6, 7 and 8 are the emitter, base and collector electrodes ohmically connected the regions 1, 2 and 3, respectively. In all the above transistors the regions 1, 2 and 3 are manufactured under the same conditions and have the same sizes and shapes, respectively. On the other hand, the $N^+$-type regions 5 formed in the neighborhood of the collector junctions 4 have different areas and shapes as shown in FIGS. 1a, 2 and 3, the areas being 560 $\mu^2$ in FIG. 1a, 1500 $\mu^2$ in FIG. 2 and 3500 $\mu^2$ in FIG. 3. The area of the emitter region 3 is 600 $\mu^2$.

These transistors are manufactured by the conventional selective diffusion technique. First, an N-type silicon substrate (collector) 1 having a conductivity of 0.2 $\Omega$ cm is prepared and the surface is oxidized. The oxide film (not shown) on the substrate 1 is next removed selectively by the conventional photoetching technique to prepare a window for base diffusion. The silicon substrate 1 is heated at 975°C for 45 minutes in an atmosphere containing boron trioxide $B_2O_3$ so that an impurity source mainly of boron is deposited on the surface of silicon substrate 1. Thereafter, gold is thinly deposited on the other major surface of the substrate 1 by the evaporation technique. The silicon substrate 1 is heat-treated at 1200°C. for 25 minutes in an atmosphere including water vapor to diffuse boron into the substrate and to form a base region 2. At the same time gold is diffused into the substrate 1. A new oxide film is formed on the surface of silicon substrate in the window portion of the oxide film. The base region 2 has a depth of about $3\mu$ and a sheet resistance of about 100 $\Omega/cm^2$.

Next, windows for the formation of emitter 3 and the $N^+$-type region 5 are prepared in the oxide film covering the surface of the substrate 1. The substrate 1 is then disposed for 8 minutes in a atmosphere including $POCl_3$ vapor with $N_2$ and $O_2$ as carrier gases at 1100°C to deposit an impurity source mainly of phosphorus on the surface of substrate 1. By the successive heat-treatment at 1080°C for 8 minutes phosphorus is diffused into the substrate, whereby an emitter region 3 and an $N^+$-type region 5 are formed in the silicon substrate 1. The emitter region 3 and the $N^+$-type region 5 have a depth of about $2\mu$ and a sheat resistance of about $3\Omega/cm^2$. Finally, by using the photoetching and evaporation techniques the collector, base and emitter electrodes 8, 7 and 6 are connected to the corresponding regions 5, 2 and 3, respectively.

The results of measurement of the characteristics of the above transistors, that is, the breakdown voltage of the PN junctions between the collector and the base regions are as shown in FIGS. 4a to 4c. FIG. 4a, where the ordinate is the number of transistors and the abscissa is the breakdown voltage, shows the characteristics of a plurality of transistors each having the transistor structure shown in FIG. 1a. FIGS. 4b and 4c show the characteristics of two groups of transistors having the transistor structures shown in FIGS. 2 and 3, respectively. As apparent from these figures, the transistors doped with gold are more influenced by the $N^+$-type region 5 than the transistors without gold. Accordingly, as the area of the $N^+$-type region 5 is larger, the breakdown voltage and the yield can be improved. Although other influences of the $N^+$-type region 5 on the characteristics are not shown, the increase of reverse current due to the soft breakdown phenomenon accompanied by the introduction of gold is prevented. Further, it was found that the current amplification factor increases with the area of the $N^+$-type region 5. These advantages are more enhanced according as the area of the $N^+$-type region 5 is larger. The effect of the $N^+$-type region becomes remarkable when the phosphorus concentration is more than $10^{20}$ atoms/cc, preferably between $10^{20}$ and $5 \times 10^{21}$ atoms/cm$^3$.

The fact that the formation of the $N^+$-type region kills the action of gold is perhaps due to the reason that gold reaches the $N^+$-type region and its neighboring region and is trapped or absorbed by it so that the gold concentration near this region is decreased.

The same result can be obtained not only in the NPN transistor but also in the junction type diode and PNP transistor when an $N^+$-type region is formed in the P-type substrate.

Therefore, the gist of this invention is the disposition of the $N^+$-type region in the isolation region of a gold doped integrated circuit device adjacent to a selected circuit element or elements.

Figure 6:
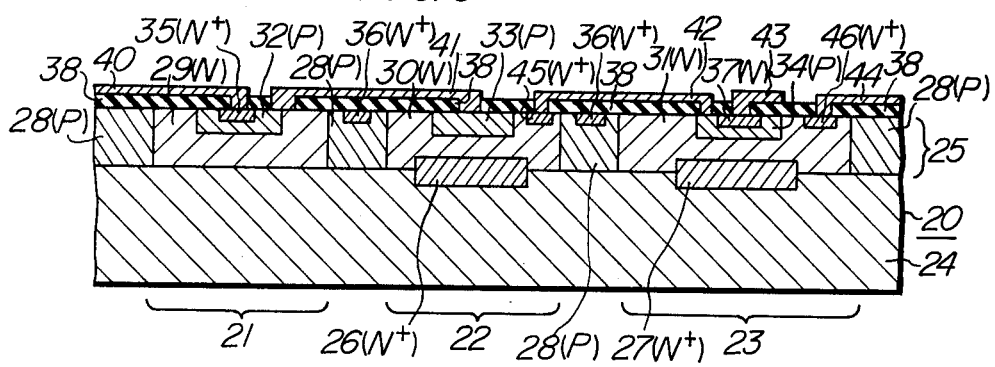
FIG. 6 is a partial cross-sectional view of an integrated circuit according to one embodiment of this invention.

Referring to FIGS. 5 and 6, and embodiment according to this invention wiill be explained. FIG. 5 shows a diode-transistor-logic circuit (DTL circuit) in which $D_1$, $D_2$ and $D_3$ are gate diodes, $D_4$ is a level shift diode (usually a plurality of such diodes are connected in series), Tr is an inverter transistor, $R_1$ is a gate resistor and $R_2$ is a load resistor. In order to decrease the time delay of the output signals with respect to the input signals and in order to prevent signal waveforms from distortion it is desirable to decrease the storage time of the gate diodes $D_1$ to $D_3$ and the inverter transistor Tr. For this purpose it is desirable to introduce a life time killer into them. On the other hand, the level shift diode $D_4$ has a function of accelerating the recovery action of the inverter transistor Tr by forcing the base potential to become zero or a reverse bias by the electric charge stored in the diode $D_4$. Therefore, the introduction of a life time killer material into the diode $D_4$ for decreasing the storage charge is unnecessary or unfavorable.

According to this embodiment, the above circuit is formed in a semiconductor substrate 20 as an integrated circuit device as shown in FIG. 6, in which the portion 21 is the gate diode $D_1$, $D_2$ or $D_3$, 22 is the level shift diode $D_4$ and 23 is the inverter transistor Tr.

The device is manufactured in the following manner. First, a P-type silicon substrate 24 is prepared. Antimony is selectively diffused into the major surface of the substrate 24 to form $N^+$-type buried layers 26 and 27. An N-type silicon epitaxial layer 25 is formed on the major surface by the epitaxial growth technique. Boron is selectively diffused into the epitaxial layer 25 to form a P-type isolation region 28 so as to reach the substrate surface and to isolate a plurality of N-type semiconductor regions 29 to 31 electrically from one another. Next, in order to form P-type regions 32 to 34 in the semiconductor regions 29 to 31, respectively, a material including an impurity such as boron oxide is deposited locally on the surface of the epitaxial layer 25, using the silicon oxide film 38 as a mask, whereby boron is diffused into the surface of the exposed epitaxial layer 25. The deposited boron oxide is removed by an etchant such as HF, and thereafter gold is deposited on the opposite major surface of the semiconductor substrate 24. The semiconductor body 20 is heat-treated in an oxidizing atmosphere containing water vapor, whereby boron contained in the surface of the epitaxial layer 25 is diffused and P-type regions 32 to 34 are formed. At the same time gold is diffused into the semiconductor body 20. During the heat-treatment an oxide film is newly formed on the epitaxial layer 25.

Then, by the selective diffusion technique a high concentration of phosphorus ($10^{20}$ to $5 \times 10^{21}$ atoms/cc) is introduced into the P-type regions 32 and 34 and into the isolation region 28 surrounding the N-type region 30 thereby to form $N^+$-type regions 35 to 37. In this case, $N^+$-type regions 45 and 46 to ensure good ohmic contacts may be formed simultaneously. Since the $N^+$-type region 36 is formed simultaneously with the $N^+$-type emitter region 37, no special step is necessary for forming the $N^+$-type region 36.

Finally, metal layers 40 to 44 serving as electrodes or wirings are formed on prescribed regions through the oxide passivation film 38. Although the $N^+$-type region 36 is annular in this embodiment, the shape may be such types as shown in FIGS. 1a and 2.

In the above embodiment, since the level shift diode 22 is surrounded with the $N^+$-type region 36 while the other diode 21 is not, the gold introduced into the silicon body reacts only with the gate diode 21 and the inverter transistor 23, but not with the level shift diode 22. By the presence of the $N^+$-type region 36 the action of gold is killed in a definite narrow region of the semiconductor material. Accordingly the degree of integration can be improved.

The $N^+$-type regions 36 can be formed in the semiconductor element regions separately from the $N^+$-type regions 45 and 46. In the above embodiment, since the isolation region 28 has a certain width, the $N^+$-type region 36 is formed in these isolation region 28 effectively. There is no necessity of an extra area for forming the $N^+$-type region 36. Neither a degradation of the degree of integration nor an increase of isolation junction capacity are observed.

Further, as explained with respect to the level shift diode the characteristics, such as the breakdown voltage and the leakage current, of particular circuit elements and their variation among the elements can be improved. Accordingly, the overall characteristics and the yield of integrated circuit are improved.

Since the impurity diffusion technique is a conventionally known method, the device can be easily manufactured by those skilled in the art by referring to the conditions described with regard to FIGS. 1a, 1b, 2 and 3. The time of introduction of gold into the silicon body 20 is not critical.

Another embodiment according to this invention will be explained with reference to FIGS. 7, 8a, 8b, 9a to 9c and 10.

Usually, when a plurality of transistors are formed in a semiconductor crystalline substrate, it has been a large restriction on the manufacture and usage of integrated circuits that the current amplification is greatly different with the types of the transistors.

In this embodiment, all the transistors formed in a semiconductor substrate are surrounded with heavily doped $N^+$-type regions, whereby the current amplification factor is kept within a certain range.

Figure 7:
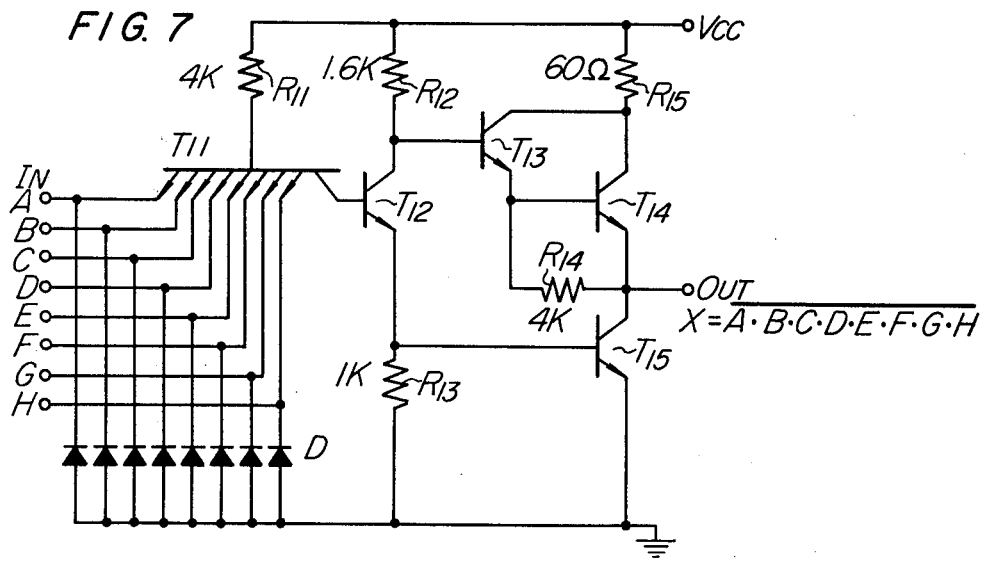
FIG. 7 is a connection diagram of an integrated circuit according to another embodiment of this invention.

FIG. 7 shows the circuit diagram of an integrated circuit to which this invention is applied. The circuit consists of a multi-emitter transistor $T_{11}$, a phase splitter $T_{12}$, transistors $T_{13}$ and $T_{14}$ connected in Darlington configuration, an inverter transistor $T_{15}$, a plurality of diodes D connected to emitters of the multiemitter transistor $T_{11}$, respectively, and resistors $R_{11}$ and $R_{15}$.

Figure 8A:
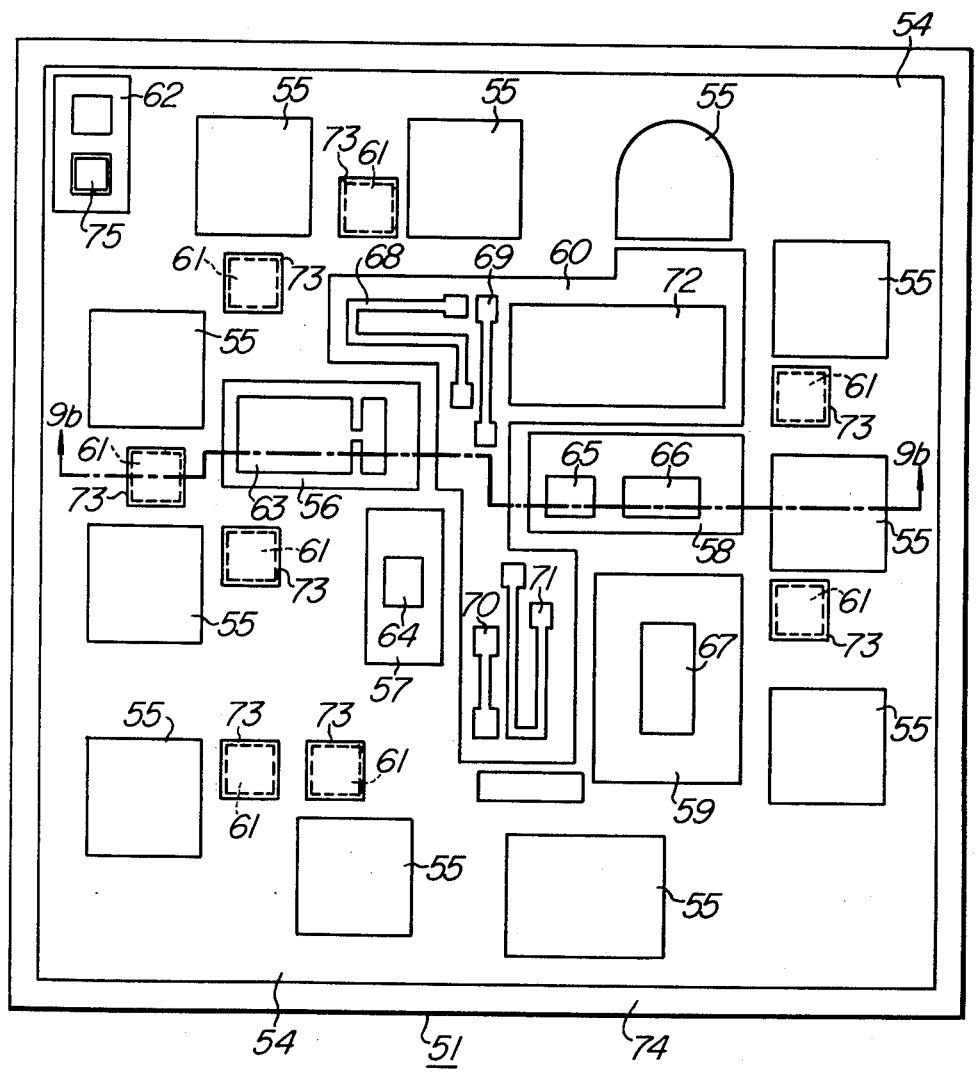
FIGS. 8a and 8b are top views of the semiconductor chip of the integrated circuit in the different manufacturing steps according to another embodiment of this invention.
Figure 8B:
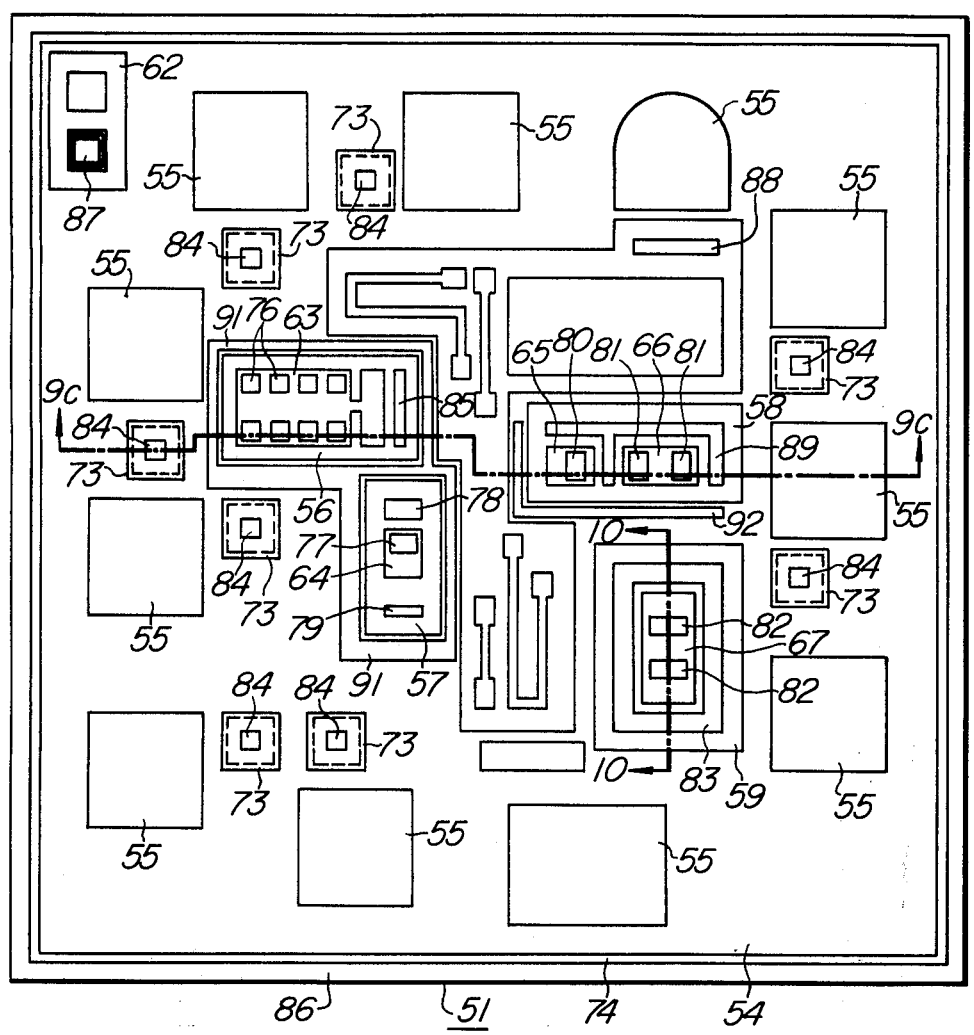

FIG. 8b shows the top view of the semiconductor substrate 51 in which the circuit shown in FIG. 7 is integrated according to this invention. In FIG. 8b, the region 56 is the collector region of the multiemitter transistor $T_{11}$ and the region 57 is the collector region of the transistor $T_{12}$, the both regions 56 and 57 being completely surrounded with the heavily doped $N^+$-type region 91. The region 58 is the common collector of the transistors $T_{13}$ and $T_{14}$. The base regions 65 and 66 are substantially completely surrounded with the heavily doped $N^+$-type region 89 for forming an ohmic contact of the collector electrode and another such heavily doped $N^+$-type region 92 according to this invention. The region 59 is the collector region of the inverter transistor $T_{15}$. The heavily doped $N^+$-type region 83 according to this invention is formed in the collector region 59 so as to completely surround the base region 67.

FIG. 8a shows the top view of the semiconductor substrate 51 before the formation of the emitter regions and other $N^+$-type high impurity concentration regions.

The manufacturing steps of the integrated circuit according to this embodiment will be explained with reference to FIGS. 8a, 8b, 9a, 9b, 9c and 10.

Figure 9A:
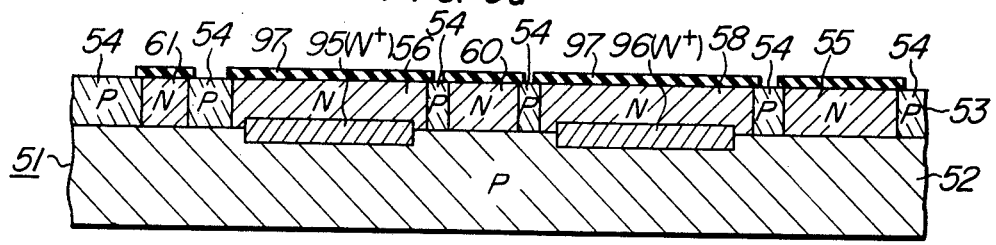
FIGS. 9a to 9c and 10 are cross-sectional views of the semiconductor chip shown in FIGS. 8a and 8b in the various manufacturing steps according to this invention.
Figure 10:
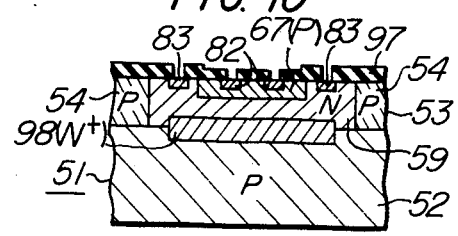

First, a semiconductor substrate 52, for example, of monocrystalline P-type silicon is prepared. Regions 95, 96 and 98 heavily doped with an N-type impurity are formed in the prescribed portions of the major surface of the substrate 52, as shown in FIGS. 9a and 10. By using the wellknown vapor phase growth method, an N-type epitaxial layer 53 of monocrystalline silicon is grown on the surface of the semiconductor substrate 52. This epitaxial layer 53 has a resistivity of about 0.2 $\Omega$ cm and a thickness of about 10 $\mu$. The heavily doped $N^+$-type regions 95, 96 and 98 are buried under the epitaxial layer 53.

Next, by the wellknown selective diffusion technique a P-type determining impurity is locally diffused into the epitaxial layer 53 through the holes or slots made in the mask layer 97 of silicon dioxide, whereby an isolation region 54 reaching the P-type semiconductor substrate 52 is formed as shown in FIG. 9a. The epitaxial layer 53 is divided into a plurality of N-type regions 55 to 62 by the isolation region 54, as shown in FIG. 8a.

Figure 9B:
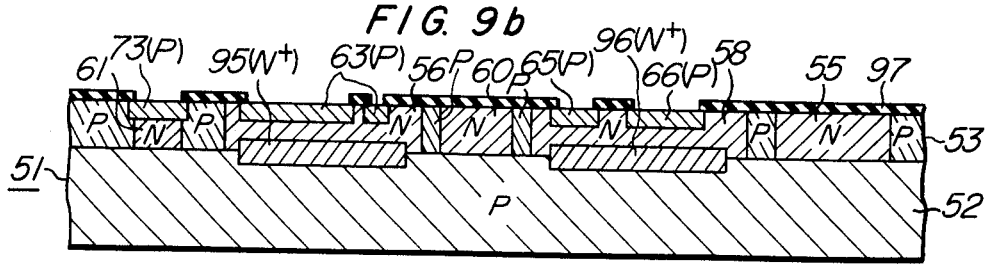

A P-type impurity, for example, boron, is diffused into prescribed positions of the epitaxial layer 53 through the holes or slots in the mask 97, as shown in FIG. 9b, by using the wellknown diffusion method thereby to form P-type regions 63 to 75 as shown in FIG. 8a. The P-type regions 73 have a larger extension area than the N-type isolated regions 61 and cover them completely. The diffusion of impurity is done in an oxidizing atmosphere so that the surface of the epitaxial layer exposed by the holes or slots in the mask layer 97 is oxidized and covered again with a silicon oxide layer.

Figure 9C:
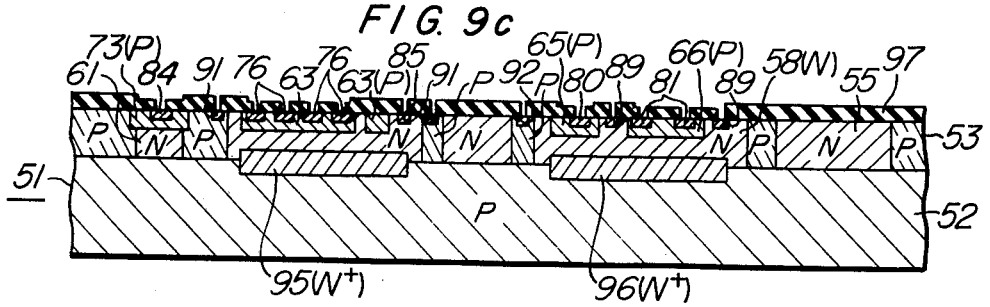

As shown in FIG. 9c, through the holes or slots in the oxide layer 97 an N-type impurity, for example, phosphorus is diffused into prescribed positions of the epitaxial layer 53, thereby to form a plurality of heavily doped $N^+$-type regions 76 to 89, 91 and 92, as shown in FIG. 8b. The P-type region 63 formed in the N-type region 56 or the collector region of the multiemitter transistor $T_{11}$ serves as the base of the transistor, while a plurality of N⁺-type regions 76 formed in the base region 63 serves as the emitter of the transistor $T_{11}$. The heavily doped N⁺-type region 85 is formed for connecting an ohmic contact to the collector region 56 which is completely surrounded with the heavily doped N⁺-type region 91 formed in the isolation region 54. The heavily doped N⁺-type region 91 has a depth of about 2 $\mu$, and a width of about 2 $\mu$. It is formed at a distance of about 1 $\mu$ from the collector region and about 25 $\mu$ from the base region 63. It is desirable that the impurity concentration of this N⁺-type region 91 is from $10^{20}$ to $5 \times 10^{21}$ atoms/cm³.

In FIG. 8b, the N-type region 57 is the collector region of the phase splitter transistor $T_{12}$. A P-type base region 64, an N⁺-type emitter region 77 formed in the base region 64, and heavily doped N⁺-type regions 78 and 79 for forming a collector ohmic contact are contained in the collector region 57. As in the case of the transistor $T_{11}$ the transistor $T_{12}$ is also surrounded completely with the heavily doped N⁺-type region 91 which is formed in the isolation region 54 in accordance with this invention. Although not shown, under the collector region 57 of the transistor $T_{12}$ a heavily doped N⁺-type buried layer is formed as seen in the region 95.

The N-type region 58 acts as the common collector of the two transistors $T_{11}$ and $T_{14}$ which are connected to form a Darlington circuit. In this N-type region 58, the P-type base region 65 and the N⁺-type emitter region 80 of the transistor $T_{13}$, and the P-type base region 66 and the N⁺-type emitter regions 81 of the transistor $T_{14}$ are formed. The heavily doped N⁺-type region 89 formed in the shape of an F is for forming an ohmic contact of the common collector region 58. A heavily doped N⁺-type region 92 is formed in the shape of an L in the isolation region 54 in accordance with this invention. Although the transistors $T_{13}$ and $T_{14}$ differ from the transistors $T_{11}$ and $T_{12}$ in that the heavily doped N⁺-type region 92 does not completely surround the base regions 65 and 66, the surrounding of the base regions 65 with the N⁺-type regions is substantially completed by the region 92 in collaboration with the heavily doped N⁺-type region 89.

The N-type region 59 acts as the collector region of the inverter transistor $T_{15}$ and contains the base region 67 and a plurality of N-type emitter regions 82. The transistor $T_{15}$ is different from transistors $T_{11}$, $T_{12}$, $T_{13}$ and $T_{14}$ in that the heavily doped N⁺-type region 83 is formed in the collector region 59 so as to surround the base region 67. The region 83 formed annularly according to this invention is also for forming an ohmic contact to the collector region 59. The cross-section of transistor $T_{15}$ is shown in FIG. 10.

The region 62 shown in FIG. 8b is a test element. Since this region has no direct relation to this invention, explanation of it will be omitted.

A plurality of P-type regions 68 to 72 formed in the N-type region 60 as shown in FIG. 8a constitute the resistors $R_{11}$ to $R_{15}$ in the circuit shown in FIG. 7. The value of $R_{11}$ and $R_{14}$ is 4 k$\Omega$, $R_{12}$ is 1.6 k$\Omega$, $R_{13}$ is 1 k$\Omega$ and $R_{15}$ is 60 r. A plurality of P-type regions 73 and N⁺-type regions 84 form the PN junction diodes D shown in FIG. 7.

Gold is then thinly evaporated on the back side of the semiconductor substrate 51, and diffused into the substrate by heating the substrate 51 at about 1000°C.

A plurality of circuit elements thus formed are connected with one another by metal layers, for example, of aluminium extending over the oxide film 97 so as to constitute a circuit as shown in FIG. 7.

Eleven samples were taken out of the same type of semiconductor integrated circuits manufactured by the abovementioned method. The result of the measurement of the base current $I_B$ under a particular condition of the transistors formed in the substrate 51 is shown in FIG. 11b, in which groups of dots on the columns $T_{11}$ to $T_{15}$ show the measured values. The columns $T_{11}$ to $T_{15}$ correspond to the transistors $T_{11}$ to $T_{11}$ respectively. The corresponding dots, for example, the left end dots in the respective columns show the data on the transistors formed in the same semiconductor substrate. As is apparent from this figure, when the operation conditions are the same, for example, the emitter current $I_E = 1$ $mA$ and the collector voltage $V_{CE} = 1v$, the base current $I_B$ or the current amplification factor ($h_{FE} = I_C/I_B$) distributes within a certain narrow range.

FIGS. 11a shows the distribution of the base current, or the current amplification factor, when the semiconductor integrated circuit does not have such heavily doped N⁺-type regions. As apparent from this figure, the current amplification factor differs with the type of transistor in the substrate. That is, the base current $I_B$ distributes in a wide range. Therefore, by surrounding the transistors formed in the semiconductor substrate with heavily doped N⁺ regions the current amplification factor can be made to be distributed in a narrow constant range. Further, when a plurality of integrated circuits of the same type are manufactured simultaneously, it is desirable that the current amplification factor of the transistors formed in each integrated circuit is in as small a range as possible, which can be realized by the application of this invention. More particularly, the multi-emitter transistor manufactured by the conventional method has a large variation in the base current $I_B$ since the base region is not surrounded with an N⁺-type region in order to decrease the current amplification factor in the lateral direction. A more unfavorable thing is that the breakdown voltage between the emitter and the collector is reduced, as described with reference to FIG. 4a, and this has been a main reason for a decrease in the yield. The degradation of the yield was more remarkable, accordingly, the overall current amplification factor of an integrated circuit was larger. However, by the application of this invention, that is, by surrounding the base region with the N⁺-type region, the breakdown voltage becomes high even when the current amplification factor is large, and a high yield is attained.

The trapping action of the N⁺-type region, that is, the localized kill of the action of gold in the semiconductor substrate is determined by the size, shape, impurity concentration of the N⁺-type region and by the relative position between the N⁺-type region and the semiconductor region where the trapping action is desired. These conditions may be arbitrarily determined in applying the present invention.

Although explanation has been made of particular embodiments of this invention, it is not limited thereto but may be altered without departing from the spirit of the invention. For example, gold may be introduced into the semiconductor so as to control the size of the N⁺-type region, and hence control the current amplification factor of plural transistors in the substrate to a suitable value in accordance with requirements.

We claim:

1. A multi-emitter transistor comprising a semiconductor substrate having a major surface, said semiconductor substrate being doped with a life time killer material; a collector region of a first conductivity type defined in said semiconductor substrate and extending to the major surface; a further region of a second conductivity type formed in said semiconductor substrate and forming, with said collector region, a PN junction terminating at said major surface; a base region of the second conductivity type formed in the collector region and extending to the major surface; a plurality of heavily doped first conductivity type emitter regions formed in the base region and extending to the major surface; and at least one heavily doped N-type region formed in the semiconductor substrate and completely surrounding the base region, at least a part of said heavily doped N-type region being formed in said further region, wherein said first conductivity type is N-type and said second conductivity type is P-type.

2. A multi-emitter transistor according to claim 1, wherein said life time killer is gold and said heavily doped N-type region is doped with phosphorus.

3. A multi-emitter transistor according to claim 2, wherein the impurity concentration of phosphorus in said heavily doped N-type region is from $10^{20}$ to $5 \times 10^{21}$ atoms/cc.

4. In a multi-emitter transistor structure, said multi-emitter transistor structure being doped with a lifetime killer material, comprising:
   a collector region of a first conductivity type;
   a base region of a second conductivity type formed in said collector region;
   a plurality of emitter regions of the first conductivity type formed in said base region; and
   a heavily doped contact region of the first conductivity type formed in said collector region for collector ohmic contact, said heavily doped contact region being formed along only part of the periphery of the base region for decreasing the current amplification in the lateral direction;
   the improvement comprising that said structure further comprises a further region of said second conductivity type surrounding said base region at a common surface of said collector region and said further region; and
   an N-type heavily doped region formed in said further region, so as to substantially surround said base region, wherein said first conductivity type is N-type, and said second conductivity type is P-type.

5. In a multi-emitter transistor structure said multi-emitter structure being doped with a life time killer material, comprising:
   an N-type collector region;
   a P-type base region formed in said collector region;
   a plurality of N-type emitter regions formed in said base region; and
   a heavily doped N-type contact region formed in said collector region for the collector ohmic contact, said heavily doped contact region being formed along only part of the periphery of the base region for decreasing the current amplification in the lateral direction;
   the improvement comprising that said structure further comprises a P-type further region along said base region at a common surface of said collector region and said further region; and
   an N-type heavily doped region formed in said further region, so as to substantially surround said base region by itself or in cooperation with said heavily doped contact region.

6. The improvement according to claim 5, further comprising a heavily doped buried region of N-type spreading underneath the entire area of said base region.

7. The improvement according to claim 5, wherein said N-type collector region divides said P-type base region into first and second surface portions contiguous to one another by a narrow base portion therebetween, said N-type emitter regions being disposed in said first surface portion, and said heavily doped N-type contact region being disposed adjacent said second surface portion of said P-type base region, so as to be spaced from said plurality of N-type emitter regions thereby.

8. An integrated circuit device comprising a semiconductor substrate of a first conductivity type having a major surface; a plurality of semiconductor regions of a second conductivity type disposed on said major surface of the substrate so as to be spaced from each other and so as to have a common surface, at least one of the semiconductor regions including a base region of the first conductivity type and an emitter region of the second conductivity type formed in said base region so as to constitute a transistor, at least one of the semiconductor regions being doped with a life time killer material; an isolation region of the first conductivity type semiconductor material disposed on the major surface of the substrate among said plurality of semiconductor regions and defining PN junctions terminating at said common surface with said plurality of semiconductor regions, respectively; and auxiliary means including at least one heavily doped N-type region formed in said isolation region so as to surround the base region of said transistor at said common surface, wherein said first conductivity type is a P-type, and said second conductivity type is an N-type, and wherein at least some of the semiconductor regions include P-type base regions and N-type emitter regions formed in said base regions, respectively, so as to constitute a plurality of NPN-type transistors, said auxiliary means includes a plurality of heavily doped N-type regions formed in said isolation region and in at least one of said semiconductor regions so as to surround all of the base regions of said transistors at said common surface, respectively.

9. An integrated circuit device according to claim 8, wherein said plurality of heavily doped N-type regions are doped with phosphorus to have an impurity concentration of from $10^{20}$ to $5 \times 10^{21}$ atoms/cc and said life time killer material is gold.

10. An integrated circuit device comprising:
   a semiconductor body having a major surface, said body being doped with a life time killer material;
   a plurality of transistors formed in the major surface so as to be spaced from each other, each transistor including a P-type base region,
   at least one P-type isolation region formed between said transistors so as to electrically isolate said transistors from each other, and at least one heavily doped N-type semiconductor region formed in the major surface, so as to essentially surround each base region of each of said transistors, at least a portion of said heavily doped N-type semiconductor region being disposed in said isolation region.

11. An integrated circuit device according to claim 10 wherein said body includes phosphorus with an impurity concentration of $10^{20}$ to $5 \times 10^{21}$ atoms/cc.

12. An integrated circuit device according to claim 10, wherein at least one of said base regions has a plurality of emitter regions therein so as to provide at least one multi-emitter transistor.

13. An integrated circuit device according to claim 10, wherein another portion of said heavily doped N-type semiconductor region is disposed in at least one of said collector regions.

* * * * *